(12) United States Patent
Pearson et al.

(10) Patent No.: US 8,131,903 B2
(45) Date of Patent: Mar. 6, 2012

(54) MULTI-CHANNEL MEMORY CONNECTION SYSTEM AND METHOD

(75) Inventors: Roger A. Pearson, Fort Collins, CO (US); Shane Ward, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 150 days.

(21) Appl. No.: 11/799,169

(22) Filed: Apr. 30, 2007

(65) Prior Publication Data
US 2008/0270649 A1 Oct. 30, 2008

(51) Int. Cl.
*G06F 13/00* (2006.01)
*G06F 13/28* (2006.01)
*H05K 7/10* (2006.01)
(52) U.S. Cl. .......... 710/301; 710/100; 711/115
(58) Field of Classification Search .......... 710/100, 710/301; 711/115
See application file for complete search history.

(56) References Cited

U.S. PATENT DOCUMENTS
6,034,878 A * 3/2000 Osaka et al. ............ 365/52
(Continued)

FOREIGN PATENT DOCUMENTS
EP 880142 A1 * 11/1998
(Continued)

OTHER PUBLICATIONS
"NN9408627: Personal Computer Mechanical Package", Aug. 1, 1994, IBM, IBM Technical Disclosure Bulletin, vol. 37, Iss. 8, pp. 627-630.*
(Continued)

*Primary Examiner* — Faisal M Zaman

(57) ABSTRACT

A multi-channel memory connection system comprises a circuit board comprising a plurality of memory connectors, at least one of the plurality of memory connectors configured to receive either a memory module or a memory riser, the at least one memory connector having at least two memory channels connected thereto through the circuit board.

10 Claims, 1 Drawing Sheet

U.S. PATENT DOCUMENTS

| | | | |
|---|---|---|---|
| 6,125,419 A * | 9/2000 | Umemura et al. | 710/110 |
| 6,170,035 B1 * | 1/2001 | Gianellini et al. | 711/5 |
| 6,247,078 B1 * | 6/2001 | Ebert et al. | 710/301 |
| 6,349,050 B1 * | 2/2002 | Woo et al. | 365/51 |
| 6,363,450 B1 * | 3/2002 | Lash et al. | 710/301 |
| 6,401,157 B1 * | 6/2002 | Nguyen et al. | 710/302 |
| 6,427,198 B1 * | 7/2002 | Berglund et al. | 711/170 |
| 6,600,790 B1 * | 7/2003 | Umemura et al. | 375/257 |
| 6,724,685 B2 * | 4/2004 | Braun et al. | 365/194 |
| 6,772,262 B1 * | 8/2004 | Park et al. | 710/301 |
| 6,889,280 B1 | 5/2005 | Barmore | |
| 7,254,663 B2 * | 8/2007 | Bartley et al. | 710/305 |
| 7,313,715 B2 * | 12/2007 | Yoo et al. | 713/500 |
| 7,334,070 B2 * | 2/2008 | Borkenhagen | 710/100 |
| 7,353,316 B2 * | 4/2008 | Erdmann | 710/316 |
| 7,389,381 B1 * | 6/2008 | Co | 711/115 |
| 7,421,598 B2 * | 9/2008 | Brittain et al. | 713/320 |
| 7,577,789 B2 * | 8/2009 | Perego et al. | 711/115 |
| 2001/0023144 A1 * | 9/2001 | Shepherd | 439/110 |
| 2002/0010835 A1 * | 1/2002 | Post et al. | 711/115 |
| 2002/0084458 A1 * | 7/2002 | Halbert et al. | 257/63 |
| 2003/0099138 A1 * | 5/2003 | Kyung | 365/200 |
| 2004/0250153 A1 * | 12/2004 | Vogt | 713/500 |
| 2006/0036826 A1 * | 2/2006 | Dell et al. | 711/167 |
| 2006/0174140 A1 * | 8/2006 | Harris et al. | 713/300 |
| 2007/0088995 A1 * | 4/2007 | Tsern et al. | 714/724 |
| 2007/0208819 A1 * | 9/2007 | Talbot et al. | 709/208 |
| 2008/0235444 A1 * | 9/2008 | Gower et al. | 711/105 |
| 2008/0270811 A1 * | 10/2008 | Chow et al. | 713/323 |

FOREIGN PATENT DOCUMENTS

| | | | |
|---|---|---|---|
| JP | 10177427 A | * | 6/1998 |
| JP | 11175196 A | * | 7/1999 |
| JP | 2005190297 A | * | 7/2005 |

OTHER PUBLICATIONS

"NN9407189: Enhanced Riser Card with Expansion Function Capability for Personal Computers", Jul. 1, 1994, IBM, IBM Technical Disclosure Bulletin, vol. 37, Iss. 7, pp. 189-192.*

"NA9206254: Customer Selectable Ethernet Implementation", Jun. 1, 1992, IBM, IBM Technical Disclosure Bulletin, vol. 35, Iss. 1A, pp. 254-255.*

Tanabe, N.; Nakajo, H.;, "An Enhancer of Memory and Network for Cluster and its Applications," Parallel and Distributed Computing, Applications and Technologies, 2008. PDCAT 2008. Ninth International Conference on, pp. 99-106, Dec. 1-4, 2008.*

* cited by examiner

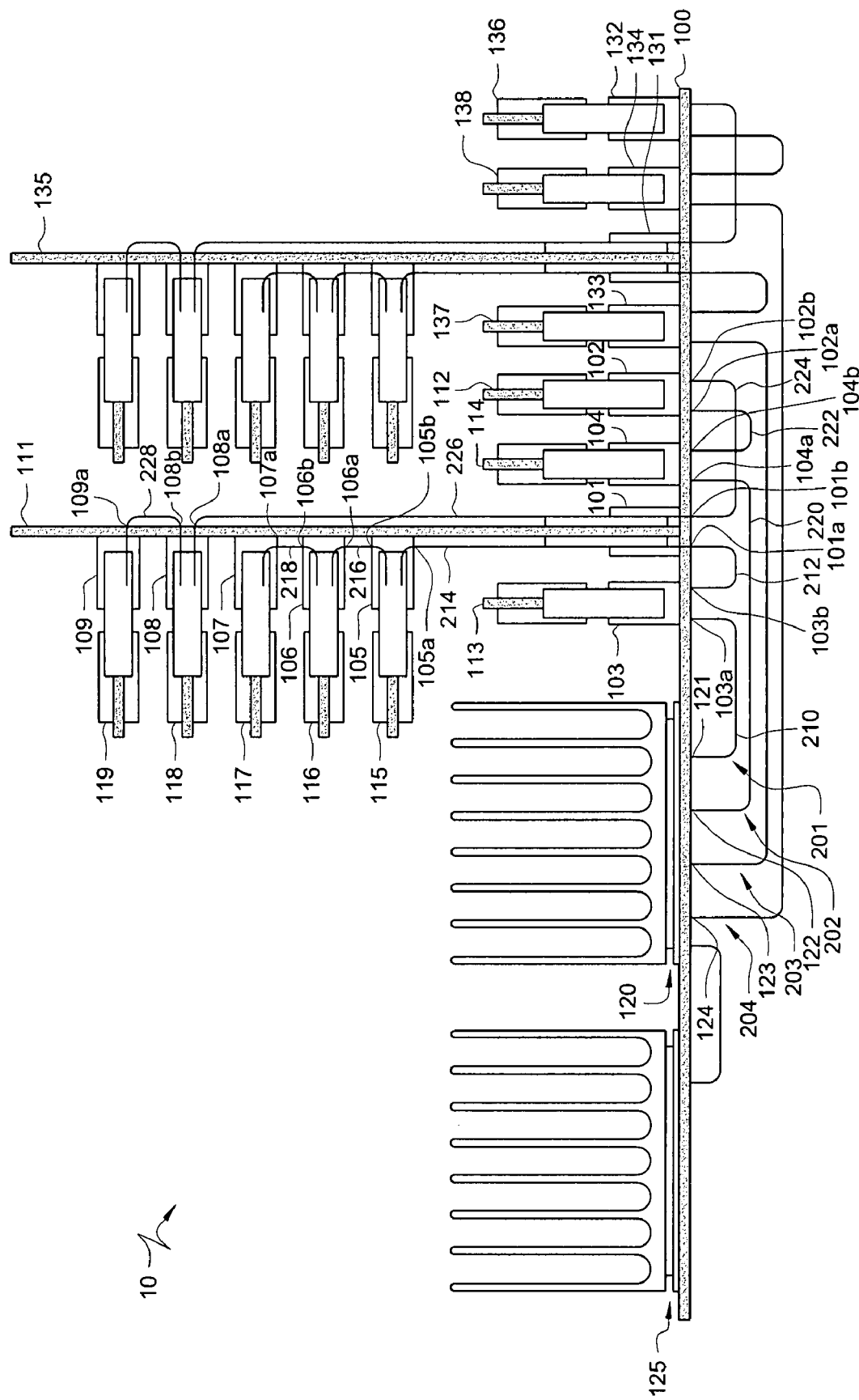

MULTI-CHANNEL MEMORY CONNECTION SYSTEM AND METHOD

BACKGROUND

Computer motherboards provide connectors for inserting memory modules, such as fully buffered dual inline memory modules (FBDIMMs). Unfortunately, the motherboards do not always provide enough connectors for the desired number of memory modules. To accommodate the extra memory modules, memory risers may be used, which are circuit boards that plug into the connectors on the motherboard. The memory risers have their own set of connectors for holding the additional memory modules. A typical computer generally uses multiple channels. Thus, multiple memory risers are generally used to provide the desired number of channels and the desired number of memory modules. However, the memory connectors on the motherboard are generally spaced so closely that space constraints prevent use of the memory risers to obtain a desired number of memory modules and channels.

BRIEF DESCRIPTION OF THE DRAWINGS

For a more complete understanding of the present application, the objects and advantages thereof, reference is now made to the following descriptions taken in conjunction with the accompanying drawings, in which.

DETAILED DESCRIPTION OF THE DRAWINGS

Figure 1:
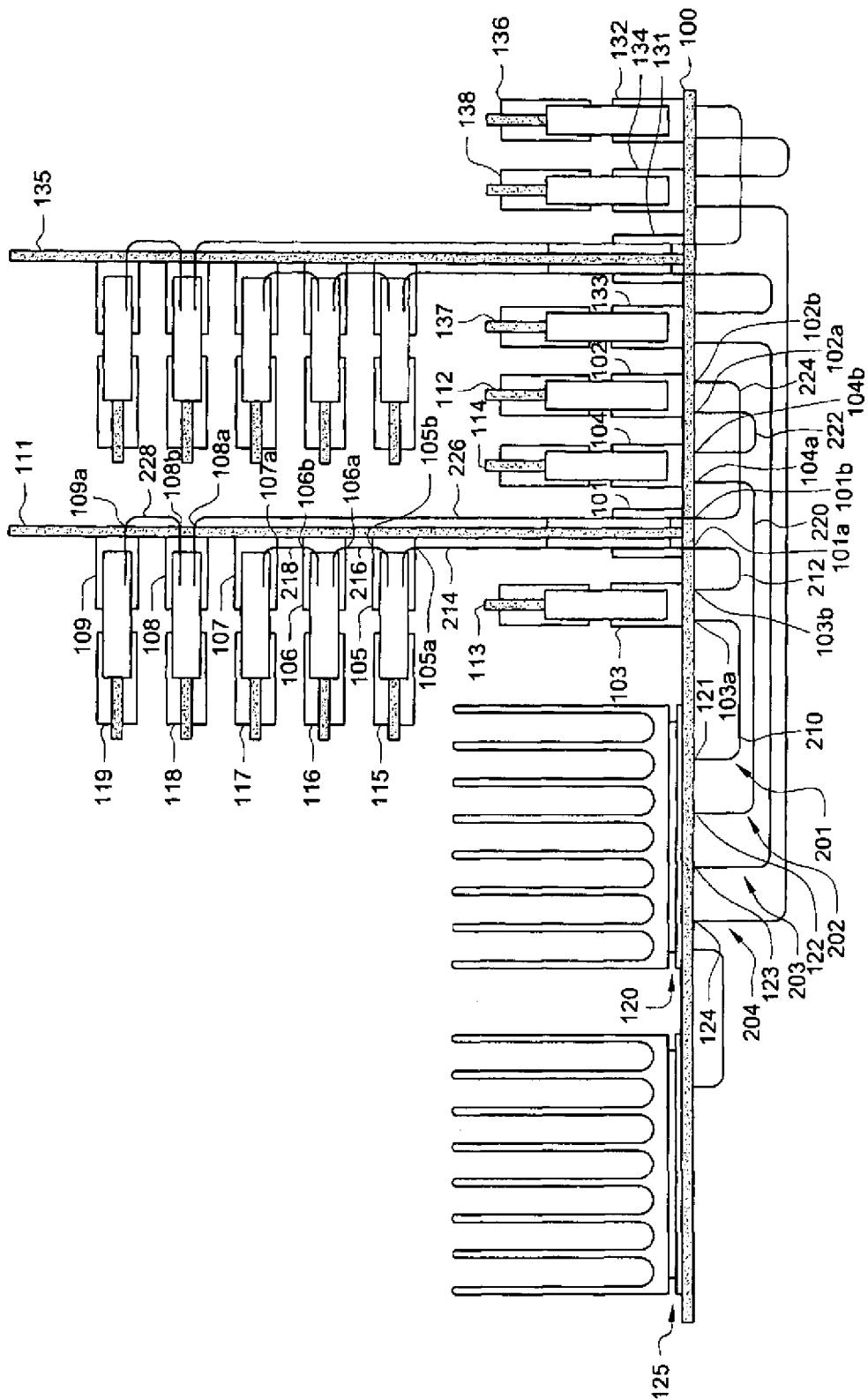
FIG. 1 is a diagram illustrating an embodiment of a multi-channel memory connection system.

FIG. 1 is a diagram illustrating an embodiment of a multi-channel memory connection system 10. System 10 enables the connection of multiple memory channels on a single memory riser, thereby reducing the number of memory risers needed and thus reducing the likelihood of mechanical interference between risers. In the embodiment illustrated in FIG. 1, system 10 comprises a circuit board 100 having a central processing unit (CPU) 125, a memory controller 120, and memory connectors 101-104 and 131-134 disposed thereon and/or coupled thereto. CPU 125 is coupled to memory controller 120 to provide an interface between CPU 120 and memory modules coupled to memory connectors 101-104 and 131-134. In FIG. 1, eight memory connectors 101-104 and 131-134 are shown attached to a single circuit board 100 with a single CPU 125 for illustration purposes; however, it should be understood that a greater or fewer quantity of memory connectors may be used. Further, it should be understood that circuit board 100 may comprise a single board or multiple boards, and that system 10 may be implemented with multiple CPUs and/or multiple memory controllers.

In FIG. 1, memory modules 112-114 and 136-138 are disposed in and/or otherwise coupled to memory connectors 102-104 and 132-134, respectively, thereby providing random access memory (RAM) for use with CPU 125 through memory controller 120. In some embodiments, memory modules 112-114 and 136-138 comprise fully buffered dual inline memory modules (FBDIMMs), although a different type of memory module may be used (e.g., memory modules using unidirectional signal routing for particular conductive paths). In the embodiment illustrated in FIG. 1, memory risers 111 and 135 are disposed in and/or otherwise coupled to memory connectors 101 and 131, respectively, and are coupled to memory connectors 102-103 and 132-133 through circuit board 100 (e.g., via conductive traces).

For ease of description, memory riser 111 and memory connectors 101-104 will be described in further detail below; however, it should be understood that memory riser 135 and memory connectors 131-143 are similarly configured in the illustrated embodiment. It should also be understood that in some embodiments, a different memory riser configuration could be used along with memory riser 111, in place of or in addition to memory riser 135, and further that memory connectors 131-143 need not be configured similarly to memory connectors 101-104.

In the embodiment illustrated in FIG. 1, memory riser 111 comprises riser memory connectors 105-109 each coupled to a respective one of memory modules 115-119 (which may also comprise FBDIMMs or a different type of memory module). In FIG. 1, memory riser 111 comprises four memory modules 115-119; however, it should be understood that the quantity of memory modules on memory riser 111 may be varied. In the embodiment illustrated in FIG. 1, memory controller 120 comprises four memory channel ports 121-124 each connected through circuit board 100 to memory connectors 103, 104, 133 and 134, respectively. In FIG. 1, southbound or downstream signal paths from memory controller 120 are illustrated representing paths used to write data and send commands to memory modules (it should be understood that separate conductive signal paths are used to provide northbound or upstream signal communications from memory modules to memory controller 120 such as for communicating read data from memory modules to memory controller 120). Memory connectors generally have primary and secondary data ports (or signal line connections). The primary data port is generally the port receiving data and commands from a southbound signal path from either memory controller 120 of another memory module, whereas the secondary port is generally the port communicating such data and commands along another southbound signal path to another memory module (if there is another memory module so connected). In FIG. 1, memory connector 101 has a primary data port 101a and a secondary data port 101b; memory connector 102 has a primary data port 102a and a secondary data port 102b; memory connector 103 has a primary data port 103a and a secondary data port 103b; and memory connector 104 has a primary data port 104a and a secondary data port 104b. Memory channel port 121 is connected to primary data port 103a through circuit board 100, and memory channel port 122 is connected to primary data port 104a through circuit board 100.

To complete the memory channels and enable tandem coupling of memory modules, secondary data port 103b is connected to primary data port 101a; secondary data port 104b is connected to primary data port 102a; and secondary data port 101b is connected to secondary data port 102b through circuit board 100. Memory riser 111, shown in FIG. 1 as coupled to memory connector 101, provides extra memory connectors 105-109 that enable the use of eight memory modules 112-119 with two memory channel ports 121 and 122 while using four memory connectors 101-104 on circuit board 100.

Memory connectors 105-109 on memory riser 111 also have primary and secondary data ports. As shown in FIG. 1, memory connector 105 has a primary data port 105a and a secondary data port 105b; memory connector 106 has a primary data port 106a and a secondary data port 106b; memory connector 107 has a primary data port 107a; memory connector 108 has a primary data port 108a and a secondary data port 108b; and memory connector 109 has a primary data port 109a. Secondary data port 105b is connected to primary data port 106a; secondary data port 106b is connected to primary data port 107a; and secondary data port 108b is connected to primary data port 109a. Primary data port 101a is coupled to primary data port 105a, and secondary data port 101b is connected to primary data port 108a. Thus, memory modules 112-119 are coupled to memory controller 120 in two channels, each channel having four memory modules in tandem. It should be understood, however, that a greater or lesser number of tandem connections may be used.

In the embodiment illustrated in FIG. 1, memory channels 201 and 202 are defined as follows: Memory channel 201 comprises a conductive signal path 210 from memory channel port 121 to primary port 103a, conductive signal paths 212 and 214 from secondary port 103b to primary port 105a through primary port 101a, a conductive signal path 216 from secondary port 105b to primary port 106a, and a conductive signal path 218 from secondary port 106b to primary port 107a. Memory channel 202 comprises a conductive signal path 220 from memory channel port 122 to primary port 104a, a conductive signal path 222 from secondary port 104b to primary port 102a, conductive signal paths 224 and 226 from secondary port 102b to primary port 108a through secondary port 101b, and a conductive signal path 228 from secondary port 108b to primary port 109a. In FIG. 1, conductive signal paths 210, 212, 214, 216, 218, 220, 222, 224, 226 and 228 are illustrated off circuit board 100 for ease of description and illustration; however, it should be understood that such signal paths are generally deposited on and/or through circuit board 100. Thus, in FIG. 1, memory connector 103 is coupled to memory channel port 121, memory connectors 102 and 104 are coupled to memory channel port 122, and memory connector 101 is coupled to both memory channel ports 121 and 122. Memory channels 203 and 204 using ports 123 and 124, along with memory connectors 131-134 and memory riser 135, are similarly configured. In some embodiments, a greater or fewer number of channels may be used.

In the embodiment illustrated in FIG. 1, memory connectors 101-104 and 131-134 are configured to receive and/or accept either a memory module or a memory riser connected thereto. Thus, in some embodiments, memory connectors 101-104 and 131-134 comprise standard, off-the-shelf components enabling flexible use thereof with either a memory module or a riser connected thereto. In the embodiment illustrated in FIG. 1, for example, a memory module similar to memory modules 112-114 and 136-138 may be installed in memory connector 101 and be replaced with a riser, such as memory riser 111, if desired. In this example, if a memory module is disposed in and/or otherwise connected to memory connector 101 instead of memory riser 111, because secondary port 101b is connected to secondary port 102b of memory connector 102, the memory modules disposed in memory connectors 101 and 102 would each be configured to be and/or otherwise treated as (e.g., by memory controller 120) a last memory module in a particular channel to avoid drive conflicts.

Thus, as illustrated in FIG. 1, embodiments of system 10 enable the secondary ports of two different memory connectors to be connected to another memory connector to facilitate two memory channels being routed to a single memory connector. For example, in FIG. 1, secondary port 103b of memory connector 103 and secondary port 102b of memory connector 102 are each connected to memory connector 101 (e.g., ports 101a and 101b, respectively) such that memory channels 201 and 202 are both routed to memory connector 101 and, in FIG. 1, to memory riser 111. In FIG. 1, circuit board 100 is similarly configured as to memory connector 131 such that memory channels 203 and 204 are each routed to memory connector 131 and, in FIG. 1, memory riser 135.

Further, in the embodiment illustrated in FIG. 1, embodiments of system 10 connect the last memory modules that are residing on circuit board 100 for respective memory channels to another distinct memory connector to facilitate two memory channels being routed to a single memory connector. For example, in the embodiment illustrated in FIG. 1, the last memory module residing on circuit board 100 for memory channel 201 is memory module 113 (via memory connector 103), and the last memory module residing on circuit board 100 for memory channel 202 is memory module 112 (via memory connector 102). As illustrated in FIG. 1, memory modules 113 and 112 are each connected to memory connector 101 (e.g., via signal paths 212 and 224, respectively), thereby enabling two different memory channels (e.g. memory channels 201 and 202) to be routed to memory connector 101 and to memory riser 111.

It should be noted that, while FIG. 1 shows memory riser 111 in memory connector 101 and memory riser 135 in memory connector 131, alternate configurations may be used. For example, memory riser 135 may be swapped with memory module 136 to provide extra clearance between memory riser 135 and memory riser 111, even without requiring any modifications to circuit board 100. Likewise, memory riser 111 may be swapped with memory module 112 without requiring any modifications to circuit board 100, provided mechanical interference between memory riser 111 and memory riser 135 is avoided. Swapping memory riser 111 with memory module 112 changes which memory modules are coupled to memory channel ports 121 and 122. For example, with memory riser 111 in memory connector 101 and memory module 112 in memory connector 102, memory modules 113, 115, 116 and 117 are coupled to memory channel port 121, and memory modules 112, 114, 118 and 119 are coupled to memory channel port 122. With memory riser 111 in memory connector 102 and memory module 112 in memory connector 101, memory modules 113, 112, 118 and 119 are coupled to memory channel port 121, and memory modules 114, 115, 116 and 117 are coupled to memory channel port 122. Thus, it should be understood that embodiments of system 10 enable greater flexibility for locating and/or using memory modules and memory risers.

Thus, in some embodiments, a method of manufacturing multi-channel memory connection system 10 comprises providing a circuit board having a secondary port of one memory connector disposed on the circuit board to a secondary port of another memory connector disposed on the circuit board. System 10 may also be manufactured by coupling a memory riser to one of the aforementioned memory connectors disposed on the circuit board. System 10 may also be manufactured by coupling a primary port of a memory connector disposed on the memory riser to a primary port of one of the memory connectors on the circuit board having its secondary port coupled to a secondary port of another memory connector on the circuit board.

What is claimed is:

1. A multi-channel memory connection system, comprising:
  a circuit board comprising a plurality of memory connectors configured to receive either a memory module or a memory riser,
  wherein at least one memory connector includes a primary port connected to at least one bi-directional memory channel on the circuit board and a secondary port connected to the at least one bi-directional memory channel on the circuit board,
  and the memory riser includes a bi-directional memory channel connectable to the primary port and another bi-directional memory channel connectable to the secondary port, wherein the bi-directional memory channel and the another bi-directional memory channel are not connected and are operable to simultaneously send data to a memory controller, and when the memory riser is connected to the at least one memory connector, the at least one bi-directional memory channel on the circuit board operates as two different bi-directional memory channels comprising a first bi-directional memory channel connected to the bi-directional memory channel in the memory riser via the primary port and a second bi-directional memory channel connected to the another bi-directional memory channel in the memory riser via the secondary port, and when the memory module is connected to the at least one memory connector, the at least one bi-directional memory channel on the circuit board operates as a single bi-directional memory channel at the at least one connector, wherein the single bi-directional memory channel is connected to the memory module via the primary port and the secondary port.

2. The system of claim 1, further comprising the memory controller configured to, in response to the memory module being disposed in the at least one memory connector, cause the memory module disposed in the at least one memory connector to be configured as a last memory module in the at least one channel.

3. A method of multi-channel memory connection, comprising:

coupling a plurality of memory connectors to a circuit board, at least one of the plurality of memory connectors configured to receive either a memory module or a memory riser, wherein the at least one memory connector includes a primary port connected to at least one bi-directional memory channel on the circuit board and a secondary port connected to the at least one bi-directional memory channel on the circuit board; and connecting at least one bi-directional memory channel to the at least one memory connector along the circuit board, wherein the memory riser includes a bi-directional memory channel connectable to the primary port and another bi-directional memory channel connectable to the secondary port, wherein the bi-directional memory channel and the another bi-directional memory channel are not connected and are operable to simultaneously send data to a memory controller, and when the memory riser is connected to the at least one memory connector, the at least one bi-directional memory channel along the circuit board operates as two different bi-directional memory channels comprising a first bi-directional memory channel connected to the bi-directional memory channel in the memory riser via the primary port and a second bi-directional memory channel connected to the another bi-directional memory channel in the memory riser via the secondary port, and when the memory module is connected to the at least one memory connector, the at least one bi-directional memory channel on the circuit board operates as a single bi-directional memory channel at the at least one connector, wherein the single bi-directional memory channel is connected to the memory module via the primary port and the secondary port.

4. A multi-channel memory connection system, comprising:

a memory riser connectable to a first memory connector directly disposed on a circuit board, wherein the first memory connector includes a primary port connected to at least one bi-directional memory channel on the circuit board and a secondary port connected to the at least one bi-directional memory channel on the circuit board, the memory riser comprising:

a bi-directional memory channel connectable to the primary port and another bi-directional memory channel connectable to the secondary port, wherein the bi-directional memory channel and the another bi-directional memory channel are not connected and are operable to simultaneously send data to a memory controller, and when the memory riser is connected to the first memory connector, the at least one bi-directional memory channel along the circuit board operates as two different bi-directional memory channels comprising a first bi-directional memory channel connected to the bi-directional memory channel in the memory riser via the primary port and a second bi-directional memory channel connected to the another bi-directional memory channel in the memory riser via the secondary port, and when a memory module is connected to the first memory connector, the at least one bi-directional memory channel on the circuit board operates as a single bi-directional memory channel at the first memory connector, wherein the single bi-directional memory channel is connected to the memory module via the primary port and the secondary port.

5. The multi-channel memory connection system of claim 4, the memory riser being inserted into, and thereby electrically coupled to, the first memory connector.

6. The multi-channel memory connection system of claim 4, wherein a second memory connector and a third memory connector are directly disposed on, and thereby electrically coupled to, the memory riser.

7. A circuit board comprising:

a first memory connector; and at least one bi-directional memory channel along the circuit board, wherein the first memory connector includes a primary port connected to at least one bi-directional memory channel along the circuit board and a secondary port connected to the at least one bi-directional memory channel along the circuit board, wherein a memory riser is connectable to the first memory connector, and the memory riser includes a bi-directional memory channel connectable to the primary port and another bi-directional memory channel connectable to the secondary port, wherein the bi-directional memory channel and the another bi-directional memory channel are not connected and are operable to simultaneously send data to a memory controller, and when the memory riser is connected to the first memory connector, the at least one bi-directional memory channel along the circuit board operates as two different bi-directional memory channels comprising a first bi-directional memory channel connected to the bi-directional memory channel in the memory riser via the primary port and a second bi-directional memory channel connected to the another bi-directional memory channel in the memory riser via the secondary port, and when a memory module is connected to the first memory connector, the at least one bi-directional memory channel on the circuit board operates as a single bi-directional memory channel at the first memory connector, wherein the single bi-directional memory channel is connected to the memory module via the primary port and the secondary port.

8. The circuit board of claim 7, wherein a second memory connector and a third memory connector are directly disposed on the circuit board.

9. The circuit board of claim 7, the first memory connector directly disposed on, and thereby electrically coupled to the memory riser.

10. The circuit board of claim 7, the first memory connector directly disposed on, and thereby electrically coupled to the memory riser inserted into, and thereby electrically coupled to, a fourth memory connector directly disposed on the circuit board.

* * * * *

UNITED STATES PATENT AND TRADEMARK OFFICE
CERTIFICATE OF CORRECTION

PATENT NO.           : 8,131,903 B2
APPLICATION NO.      : 11/799169
DATED                : March 6, 2012
INVENTOR(S)          : Roger A. Pearson et al.

It is certified that error appears in the above-identified patent and that said Letters Patent is hereby corrected as shown below:

In the Drawing, in Sheet 1, line 1, above "Reference numeral 109" insert -- FIG. 1 --. (As shown on the attached sheet)

Signed and Sealed this
Sixth Day of November, 2012

David J. Kappos
*Director of the United States Patent and Trademark Office*